United States Patent
Hong

(10) Patent No.: US 7,183,205 B2
(45) Date of Patent: Feb. 27, 2007

(54) METHOD OF PITCH DIMENSION SHRINKAGE

(75) Inventor: Shih Ping Hong, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 154 days.

(21) Appl. No.: 10/863,657

(22) Filed: Jun. 8, 2004

(65) Prior Publication Data

US 2005/0272259 A1   Dec. 8, 2005

(51) Int. Cl.
*H01L 21/441* (2006.01)
(52) U.S. Cl. .................. 438/671; 438/669; 438/947; 430/325; 430/330
(58) Field of Classification Search ............... 438/669, 438/671, 947; 430/325, 330
See application file for complete search history.

(56) References Cited

U.S. PATENT DOCUMENTS

| | | | |
|---|---|---|---|
| 5,328,810 A | | 7/1994 | Lowrey et al. |
| 6,110,837 A * | | 8/2000 | Linliu et al. ................. 438/723 |
| 6,416,933 B1 * | | 7/2002 | Singh et al. ................. 430/313 |
| 6,734,107 B2 * | | 5/2004 | Lai et al. ..................... 438/696 |
| 6,750,150 B2 * | | 6/2004 | Chung et al. ................ 438/706 |
| 6,774,051 B2 * | | 8/2004 | Chung et al. ................ 438/778 |
| 6,867,116 B1 * | | 3/2005 | Chung ......................... 438/551 |
| 6,887,627 B2 * | | 5/2005 | Chung et al. ................... 430/5 |
| 6,893,972 B2 * | | 5/2005 | Rottstegge et al. .......... 438/706 |
| 6,946,400 B2 * | | 9/2005 | Chung ......................... 438/706 |
| 6,955,961 B1 * | | 10/2005 | Chung ......................... 438/241 |

\* cited by examiner

*Primary Examiner*—Zandra V. Smith
*Assistant Examiner*—Pamela E Perkins
(74) *Attorney, Agent, or Firm*—Haynes Beffel & Wolfeld LLP

(57) ABSTRACT

Roughly described, a patterned first layer is provided over a second layer which is formed over a substrate. In a conversion process, first layer material is consumed at feature sidewalls to form third layer material at the feature sidewalls. The width of third layer material at each of the sidewalls is greater than the width of first layer material consumed at the respective sidewall in the conversion process. The second layer is patterned using the third layer material as mask. A fourth layer of material is formed over the substrate, and planarized or otherwise partially removed so as to expose the top surfaces of the features in the first layer through the fourth layer. The exposed first layer material is removed to expose portions of the second layer through the fourth layer, and the second layer is further patterned using the fourth layer material as a mask.

27 Claims, 7 Drawing Sheets

METHOD OF PITCH DIMENSION SHRINKAGE

FIELD OF THE INVENTION

The present invention relates to integrated circuit fabrication methods, and more particularly to a method of fabricating integrated circuit with a reduced pitch.

BACKGROUND

Integrated circuits are commonly used to make a wide variety of electronic devices, such as memory chips. There is a strong desire to reduce the size of integrated circuits, so as to increase the density of the individual components and consequently enhance the functionality of an integrated circuit. The minimum pitch on an integrated circuit (the minimum distance between the same points of two adjacent structures of the same type, e.g., two adjacent gate conductors) is often used as a representative measure of the circuit's density. The feature width is sometimes referred to herein as F, and the width of the space between features is sometimes referred to herein as S.

Increases in circuit density often are limited by the resolution of the available photolithographic equipment. The minimum size of features and spaces that a given piece of photolithographic equipment can produce is related to its resolution capability. If one tries to define features in a photoresist which are smaller than the machine's minimum feature size, then the photoresist regions exposed to radiation may fail to correspond to the mask plate pattern, resulting in the photoresist features being skewed.

The sum of minimum feature width and minimum space width producible with a given piece of photolithographic equipment is the minimum pitch that the piece of equipment can produce. Since for practical purposes, the minimum feature width can be considered to be approximately equal to the minimum space width, the minimum pitch that can be produced with a given piece of photolithographic equipment is approximately equal to double the minimum feature width that it can produce. Using contemporary photolithography techniques, one line (feature) and one space may be defined for a given minimum pitch.

Some attempts have been made to try to reduce the pitch of an integrated circuit device below that of the minimum pitch produced lithographically, but these methods are difficult to control and show varying results.

In view of the drawbacks of the prior methods, it is necessary to provide a method that can reduce the pitch in a device below that producible by the lithographic process.

SUMMARY OF THE INVENTION

According to an aspect of the invention, roughly described, a method of manufacturing an integrated circuit includes several steps. A patterned first layer is provided, patterned with features having top surfaces and sidewalls. Typically but not necessarily, the patterning in the first layer is formed lithographically. The patterned first layer is formed over a second layer which is formed over a substrate. In a conversion process, first layer material is consumed at the feature sidewalls (and optionally at the top surfaces of the features as well), to form third layer material at the feature sidewalls. The width of third layer material at each of the sidewalls is greater than the width of first layer material consumed at the respective sidewall in the conversion process. The second layer is patterned using the third layer material as mask. A fourth layer of material is formed over the substrate, and fourth layer material is planarized or otherwise partially removed so as to expose the top surfaces of the features in the first layer material through the fourth layer. The exposed first layer material is removed to expose portions of the second layer through the fourth layer, and the second layer is further patterned using the fourth layer material as a mask. The process can be designed such that the resulting pattern in the second layer has features that are narrower than those of the initial patterned first layer.

In various embodiments, the first layer material may be polysilicon or amorphous silicon, for example, and the conversion process can be a thermal process, a chemical reaction, or an interdiffusion process, for example. The thermal process may include a thermal oxidation process, for example, or a silicide process.

The above process steps can be repeated, either before or after the instance described above, to result in features that are even further narrowed relative to the initial lithographically-produced features. If the repetition is thought of as occurring before the instance described above, then it can take the form of a predecessor instance that produces the initial patterning in the first layer for the instance described above. In this formulation, the step of providing a patterned first layer includes the steps of providing a fifth layer patterned with features having top surfaces and sidewalls, the patterned fifth layer being formed over an unpatterned first layer of the first layer material; consuming fifth layer material at the feature sidewalls in a preliminary conversion process to form sixth layer material at the feature sidewalls, the width of sixth layer material at each of the sidewalls being greater than the width of fifth layer material consumed at the respective sidewall in the preliminary conversion process; patterning the first layer using the sixth layer material as mask, forming a seventh layer of seventh layer material over the substrate; exposing the top surfaces of the features in the fifth layer material through the seventh layer; removing the exposed fifth layer material to expose portions of the first layer through the seventh layer; and further patterning the first layer using the seventh layer material as a mask.

Pitch dimensions can be narrowed even further by recycling the process flow yet again, and so on. Some of the drawbacks of lithographic processes in the prior art can be prevented.

DETAILED DESCRIPTION

Figure 1:
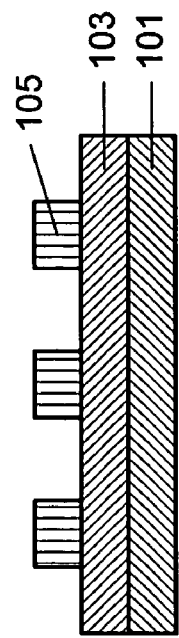
FIGS. 1–8 are elevational views of a first preferred embodiment for pitch reduction in integrated circuit fabrication.

It is to be understood and appreciated that the process steps and structures described herein do not describe a complete process flow for the manufacture of an integrated circuit. The invention may be practiced in conjunction with various integrated circuit fabrication techniques that are conventionally used in the art, or that are hereafter developed, and only so much of the commonly practiced process steps are included herein as are necessary to provide an understanding of the invention.

Referring to the drawings, FIGS. 1–8 depict a first preferred embodiment of the integrated circuit pitch reduction method of the present invention.

As shown in FIG. 1, a first layer 105 is provided over a second layer 103, which is in turn provided over a substrate 101. As used herein, one layer is "over" another layer if it is physically above the other layer. The term does not necessarily preclude one or more intervening layers, although process flow may have to be adjusted in ways that will be apparent to the reader. In addition, the layer referred to herein as the substrate may include one or more sublayers as well as impurity implants, all as desired for the ultimately desired circuitry. For example, the substrate layer 101 may include a gate dielectric layer overlying a floating gate structure, in turn overlying bulk silicon within which source and drain regions have been implanted. In this example the ultimately formed narrowed-pitch lines might function as gate conductors in a floating gate memory array.

A patterned photoresist layer 107 with a first width 109 is formed over the first layer 105. The first layer 105 may be composed of silicon material and is preferably a polysilicon layer. The polysilicon layer is formed using chemical vapor deposition (CVD) from a silane ($SiH_4$) source. The second layer 103 may be a dielectric layer and is preferably a silicon nitride layer. The Silicon nitride layer is formed using chemical vapor deposition (CVD) from a dichlorosilane ($SiCl_2H_2$) and ammonia ($NH_3$).

Figure 2:
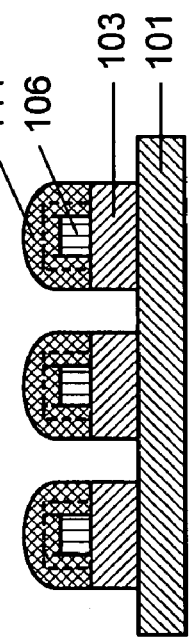

Next, as depicted in FIG. 2, a plasma etch is performed to remove the first layer 105 not covered by photoresist layer 107. Photoresist layer 107 acts as an etching mask during the patterning of the first layer 105. Photoresist layer 107 is removed after the etch process.

Figure 3:
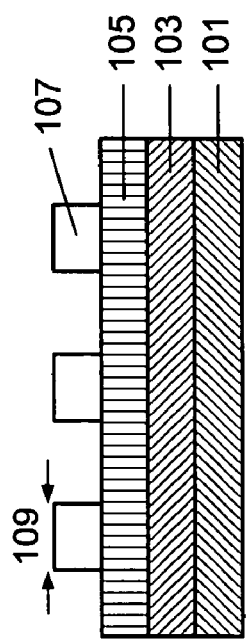

FIG. 3 illustrates the formation of a third layer 111 on the top surfaces and sidewalls of the first layer material 105. A thermal process, preferably a thermal oxidation process, is used to form the third layer 111. The process is preferably one unable to react with the underlayer such as silicon nitride layer or the second layer 103. The dimension of the patterned first layer 105, preferably a polysilicon layer, will shrink vertically and horizontally during the thermal process, and in the preferred embodiment, a silicon oxide layer will be formed on the top surfaces and sidewalls of the first layer material 105. The resulting structure has an overall width 123 which is larger than the original size of the patterned first layer 105, and encloses laterally (and vertically as well, though that is less important for purposes of this aspect of the invention) the structure of the first layer 105 having a width 113 that is now narrower than the original size of the patterned first layer 105. (The narrowed first layer 105 is now designated 106 in FIGS. 3–6.) An example suitable thermal oxidation process is to expose the wafer in an oxygen-bearing ambient environment at high temperature, e.g. 800° C. In FIG. 3, the dashed line shows the dimension change before and after this process step.

Figure 4:
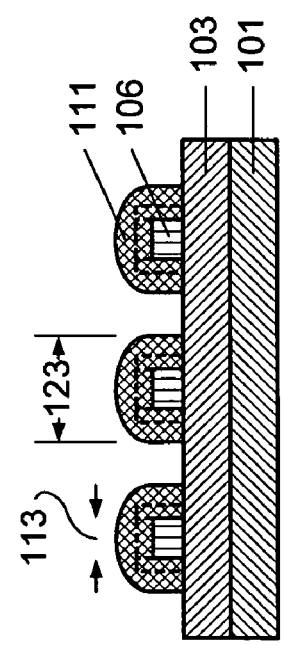

Turning to FIG. 4, the third layer 111 serves as an etching mask to pattern the second layer 103, thereby leaving portions of substrate 101 exposed. In the preferred embodiment, an anisotropic etch is used that has a high etch rate to silicon nitride and a relatively low etch rate to silicon oxide. An example of an appropriate etch chemistry is $CH_3F/O_2$ or $CH_2F_2$.

Figure 5:
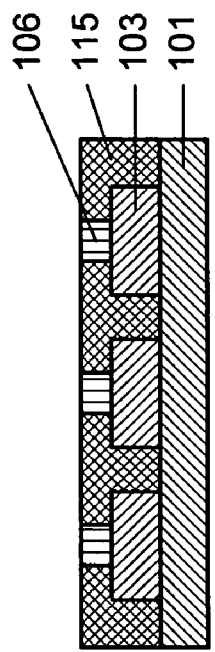

Subsequently, as shown in FIG. 5, a fourth layer 115 is formed across the configuration depicted in FIG. 4 to cover the first layer 106, the second layer 103 and the third layer 111 (not shown explicitly in FIG. 5). In a preferred embodiment, the fourth layer 115 comprises a silicon oxide layer formed by high density plasma chemical vapor deposition (CVD) with $SiH_4/O_2$/argon ($O_2$) source. In one embodiment, the third layer material 111 is removed before depositing the fourth layer 115. In another embodiment, if the fourth layer material is one that has good gap filling capability in the third layer material and can be planarized (see next step) together with the third layer material, then the third layer material need not be removed before depositing the fourth layer material.

Figure 6:
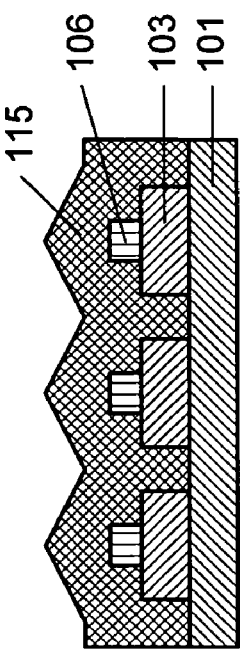

FIG. 6 illustrates the fourth layer 115 being planarized until the first layer material 106 is exposed. In the preferred embodiment, the fourth layer 115 may be removed down to the level to the top surface of the first layer 106 using Chemical Mechanical Planarization (CMP). Alternatively, The wafer may be placed within a dry etcher to remove the fourth layer 115.

Figure 7:
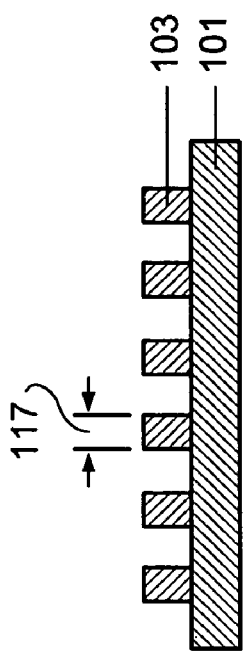

As FIG. 7 shows, the first layer 106 is then etched to expose the underlying portions of the second layer 103. The first layer 106, preferably polysilicon, is etched with a plasma process, e.g., chlorine (Cl2)/hydrogen bromide (HBr)/oxygen (O2), having a higher etching rate for the first layer material 106 than for the second layer 103 and the fourth layer 115. The openings to the second layer 103 with width 113 are formed after the etch process.

Figure 8:
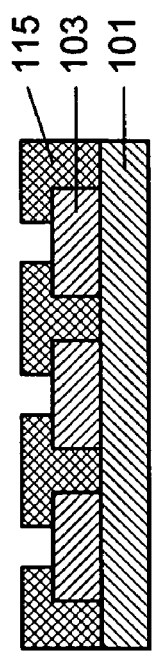

Referring to FIG. 8, a conventional etching process is performed to pattern the second layer 103 by using the fourth layer 115 as mask. The fourth layer 115 is then removed. The features patterned in the second layer 103 have a second width 117 which is narrower than the original width of the patterned first layer 105.

Figure 21:
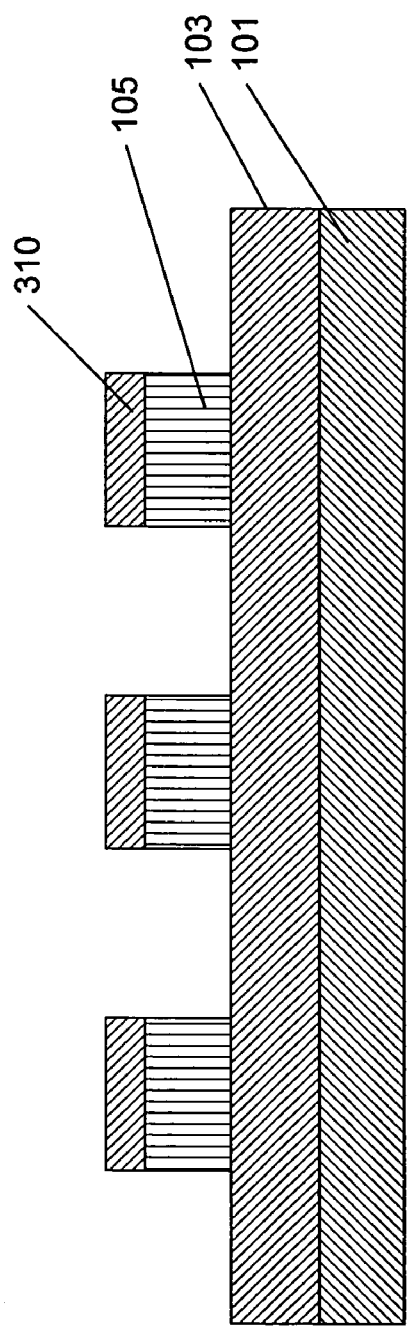
FIGS. 21–22 are elevational views for a variation of an embodiment for pitch reduction in integrated circuit fabrication.
Figure 22:
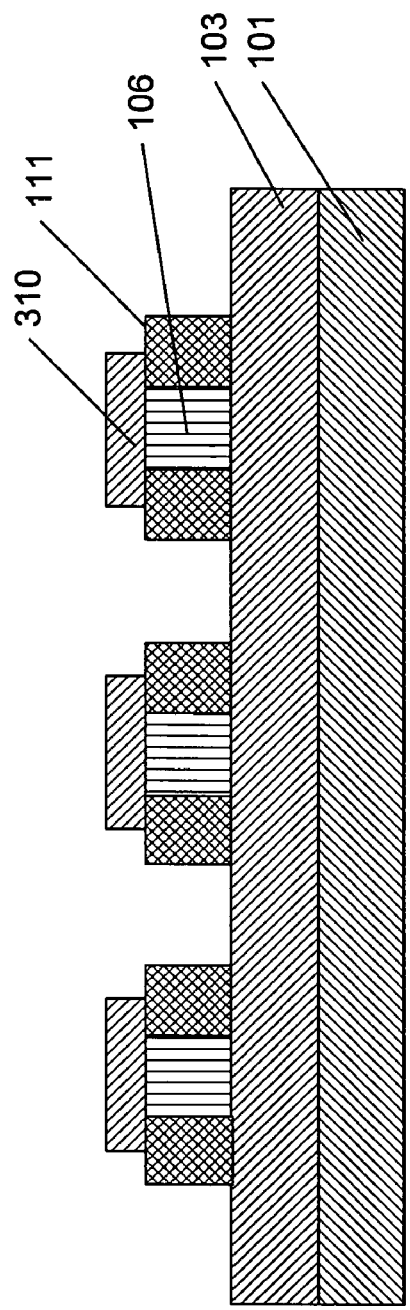

FIGS. 21 and 22 illustrate a variation of the process steps of FIGS. 2–4. As shown in FIG. 21, the first material layer 105 is superposed by an additional mask layer 310, having a pattern matching that of the first material layer 105. The additional mask layer 310 may be made of a material that is not affected by the thermal process used in FIG. 3 to convert material at the sidewalls of the first layer features to the third layer material. Thus as shown in FIG. 22, the thermal process forms third layer material at the sidewalls of the first layer features but not at the top surfaces of the first layer features. The additional mask layer material 310 is then removed in some step prior to the etching of first layer material (discussed above with reference to FIGS. 6 and 7).

Preferably, the material of the additional mask layer 310 is the essentially the same as the material of the second layer 103, so that the additional mask layer 310 will be removed as part of the same process step in which the second layer 103 is etched. For example, the additional mask layer 310 and the second layer 103 may both consist essentially of silicon nitride, and the step of etching the second layer material 103 using the third layer material 111 as a mask also etches away the additional mask layer 310.

FIGS. 9–19 depict another preferred embodiment of the present invention.

Figure 9:
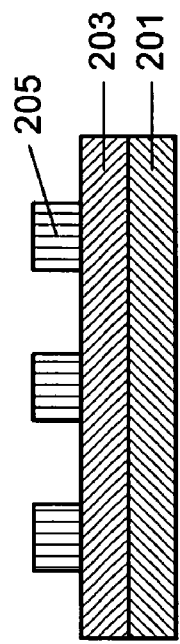
FIGS. 9–19 are elevational views of a second preferred embodiment for pitch reduction in integrated circuit fabrication.

As shown in FIG. 9, a first layer 205 and a second layer 203 are formed on a substrate 201. A patterned photoresist layer 207 with a first width 209 is formed on the surface of the first layer 205. The first layer 205 maybe composed of silicon material and is preferably a polysilicon layer. Polysilicon layer is formed using chemical vapor deposition (CVD) from a silane ($SiH_4$) source. The second layer 203 maybe composed of dielectric layer and is preferably a silicon nitride layer. Silicon nitride layer is formed using chemical vapor deposition (CVD) from silane ($SiH_4$) and $NH_3$.

Figure 10:
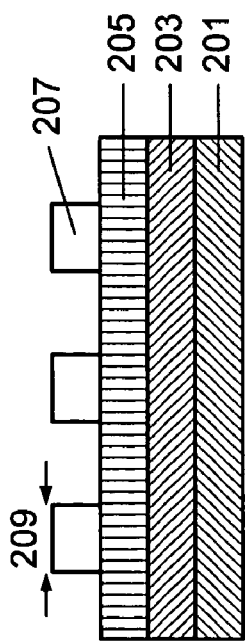

Next, as depicted in FIG. 10, a plasma etch is performed to remove the first layer 205 not covered by photoresist layer 207. Photoresist layer 207 acts as an etching mask during the patterning of the first layer 205. Photoresist layer 207 is removed after etch process.

Figure 11:
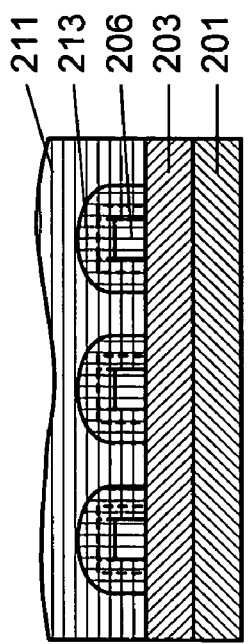
Figure 12:
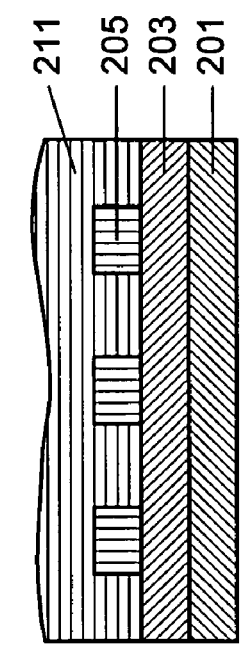
Figure 13:
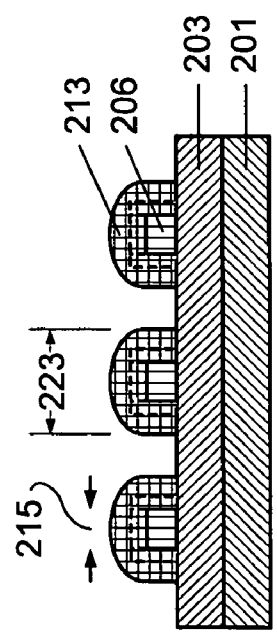

FIGS. 11–13 illustrate the formation of a third layer 213 at the top surfaces and sidewalls of the first layer material 205. A thermal process, preferably a silicide process, is used to form the third layer 213.

In order to accomplish this, referring to FIG. 11, a metal layer 211 is formed across the configuration depicted in FIG. 10. The metal layer 211 maybe composed of refractory metal formed by a sputtering process under high vacuum conditions. The refractory metal can be, for example, Platinum, Nickel, Cobalt, Titanium, Tantalum or Molybdenum.

FIG. 12 shows the growth of the third layer 213 at the top surfaces and sidewalls of the first layer 205 by a sintering process. The sintering process is preferably a rapid thermal process (RTP) in the temperature range from 400° C. to 800° C. The process used for growing the third layer 213 is preferably one unable to react with the underlayer such as silicon nitride layer or the second layer 203. The dimensions of the patterned first layer 205, preferably a polysilicon layer, will shrink vertically and horizontally during the sintering process, and in the preferred embodiment, the third layer will be formed on the top surfaces and sidewalls of the now-narrowed first layer material 205. (The narrowed first layer material is now designated 206 in FIGS. 12–17.) The third layer is preferably composed of compounds of refractory metals including $PtSi_2$, $NiSi$, $Co_2Si$, $CoSi$, $TiSi_2$, $TaSi_2$ and $MoSi_2$. After the sintering process, the residual metal film 211 is removed by a wet etch process. The structure in FIG. 13 is shown after the wet etch process. The resulting structure has an overall width 223 which is larger than the original size of the patterned first layer 205, and encloses the structure of the first layer 206 having a width 215 that is now narrower than the original size of the patterned first layer 205.

Figure 14:
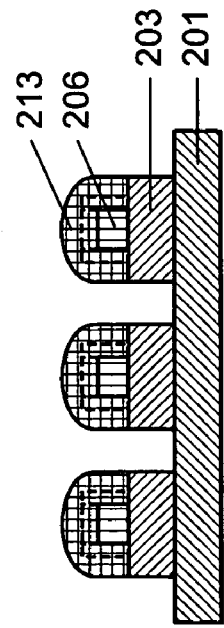

Turning to FIG. 14, the third layer 213 serves as an etching mask to pattern the second layer 203, thereby leaving portions of substrate 201 exposed. In the preferred embodiment, an anisotropic etch is used that has a high etch rate to silicon nitride and a relatively low etch rate to $TiSi_2$. An example of an appropriate etch chemistry is tetrafluoride ($CF_4$)/Hydrogen ($H_2$) gas.

Figure 15:
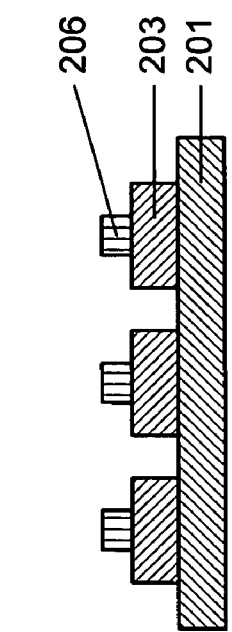

As shown in FIG. 15, the third layer 213 is removed from the configuration depicted in FIG. 14. The third layer 213 is etched with a dry etch process, having higher etching rate for the third layer 213 than for the first layer material 206 and the second layer 203.

Figure 16:
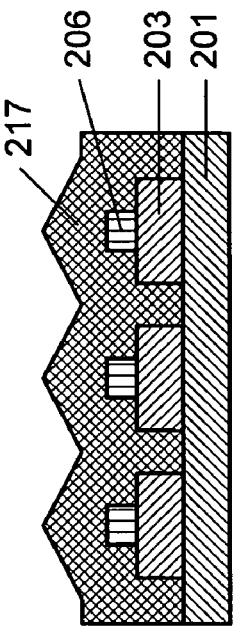

Subsequently, as shown in FIG. 16, a fourth layer 217 is formed across the configuration depicted in FIG. 15 to cover the first layer 206 and the second layer 203 on the substrate 201. In a preferred embodiment, the fourth layer 217 comprise a silicon oxide layer formed by high density plasma chemical vapor deposition (CVD) with a $SiH_4/O_2/Ar$ source.

Figure 17:
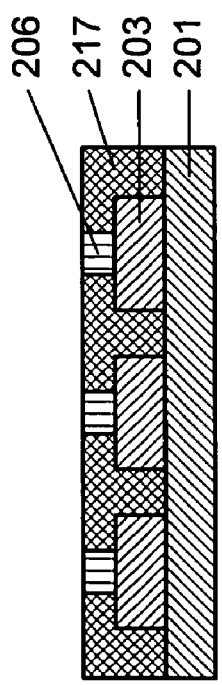

FIG. 17 illustrates the fourth layer 217 being planarized until the first layer 206 is exposed. In the preferred embodiment, the fourth layer 217 may be removed down to the level to the upper surface of the first layer 206 using CUT. Alternatively, The wafer may be placed within a dry etcher to remove the fourth layer 217.

Figure 18:
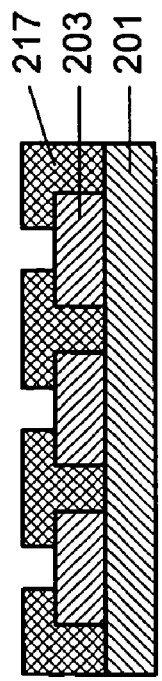

As FIG. 18 shows, the first layer 206 is etched and portions of the second layer 203 are exposed. The first layer 206, preferably polysilicon, is etched with a plasma process, e.g., chlorine ($Cl_2$)/hydrogen bromide (HBr)/oxygen ($O_2$), having a higher etching rate for the first layer material 206 than for the second layer material 203 and the fourth layer material 217. The openings to the second layer 203 with the width 215 are formed after the etch process.

Figure 19:
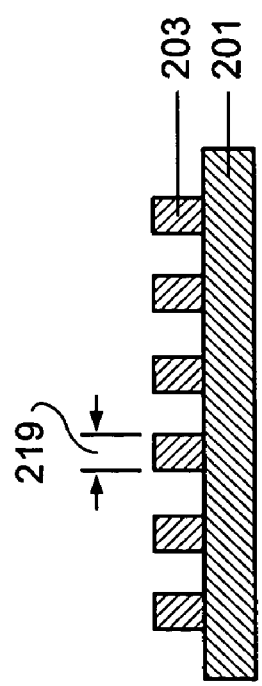

Referring to FIG. 19, a conventional etching process is performed to pattern the second layer 203 by using the fourth layer 217 as mask. The fourth layer 217 is removed after etching process. The features patterned in the second layer 203 now have a second width 219, which as mentioned, is narrower than the feature width 209 as originally patterned lithographically into the first layer 205.

Note that in all of the above embodiments, the feature narrowing process described herein can be repeated if desired, assuming appropriate materials are used in the starting structure of FIGS. 1 and 9, and substrates 101 and 201 include appropriate sublayers superposing the bulk support material. The repeated feature narrowing process can be thought of as being constructed by adding a second instance of the process steps described above either before or after the first instance described above.

In the above embodiments, the third layer material is formed at the sidewalls of the first layer material by means of processes which convert a portion of the first layer material into the third layer material. These processes can be thermal processes, as in the above-described embodiments, or can be another form of chemical reaction or interdiffusion reaction in other embodiments. Any process that converts a portion of the first layer material into the third layer material will suffice, so long as the impact of the process on other materials in the structure is insignificant or otherwise accommodated.

In addition, it will be appreciated that the process forming the third layer material has the effect of reducing the width of the first layer features, and replacing the volume of first layer material with a volume of third layer material at the sidewalls and top of the first layer features. The resulting structure has an overall width that is greater than the starting width of the first layer features, since the width of third layer material produced in the conversion process exceeds the width of first layer material consumed. The width of first layer sidewall material that is consumed in the conversion, and the width of third layer material created in the conversion, both bear on the width and regularity of the sub-lithographic features produced by the remaining steps of the process.

Figure 20:
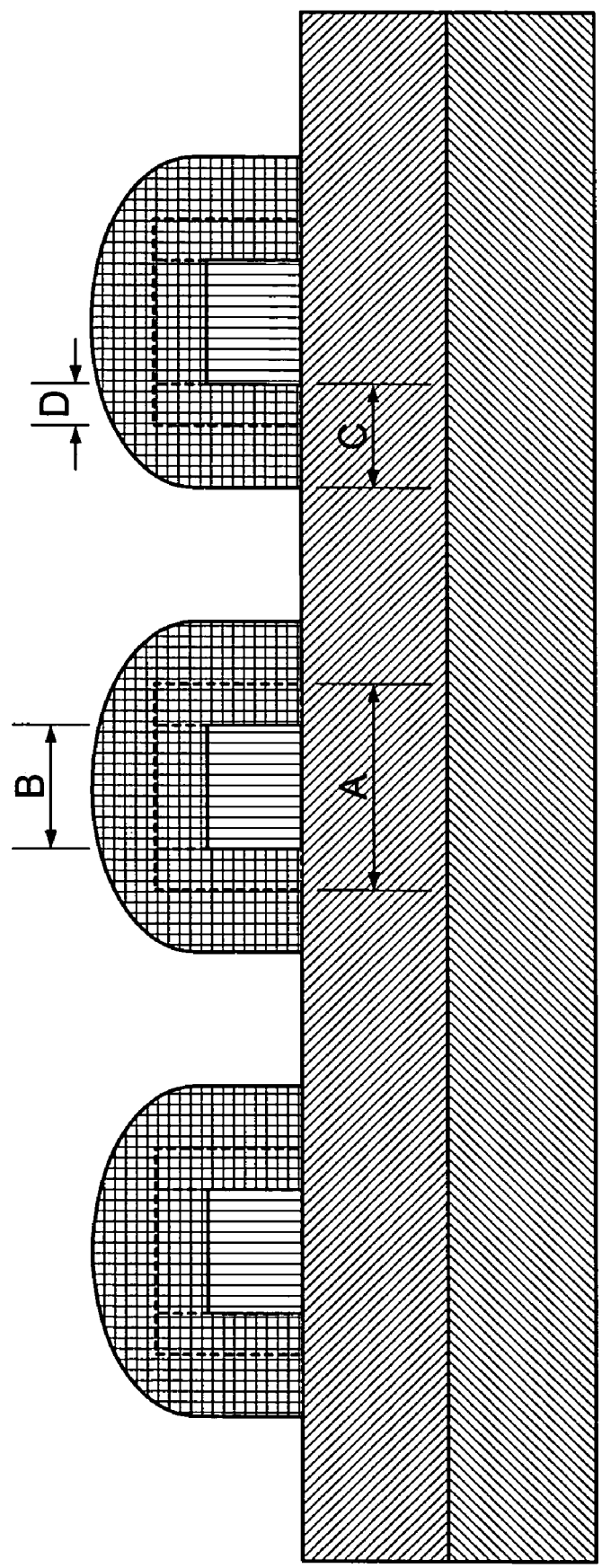
FIG. 20 is an elevational view corresponding to those of FIGS. 3 and 13.

To illustrate this concept, FIG. 20 sets forth dimensions for the views of FIGS. 3 and 13. As shown in FIG. 20, A indicates the width of an original first layer line, B indicates the width of the first layer line remaining after the conversion process, C indicates the total third layer material width on one sidewall, and D indicates the width of first layer material on one sidewall consumed during the conversion process.

In one embodiment, if the original first layer lines are formed in a regular pattern of equal width lines and spaces, the process can be used to form a new regular pattern of equal width lines and spaces at substantially one-half the pitch of the original lines. (As used herein, the term "substantially" is intended to accommodate manufacturing tolerances.) This can be accomplished by using a material conversion process in which C=2D=B (i.e. the third layer material width produced by the material conversion process on one sidewall is equal to twice the width of first layer material that is consumed from that sidewall during the conversion process, and is also equal to the width of the first layer material remaining after the conversion process). In other embodiments, however, C can be greater or less than 2D, and/or C can be greater or less than B, A can be greater or less than 2B, and/or the original first layer lines may not be formed in regular patterns of equal width lines and spaces. Variations such as these and others can be used to produce various different sub-lithographic feature patterns as desired in the resulting integrated structure.

As used herein, a particular patterned layer is "used as a mask" for a particular process step if it is the top layer present when the particular process step is performed, and also if it is only an intermediate layer present when the particular process step is performed, as long as any superposing layers are patterned the same as or more narrowly than the particular layer. In other words, as used herein, if the structure includes two patterned layers, then each of them individually, as well as both of them together, are all considered herein to act as a "mask" for the particular process step. The presence of a superposing layer having the same or narrower pattern as the particular layer does not prevent the particular layer from being "used as a mask" for the particular process step.

The above-described embodiments have been provided by way of example, and the present invention is not limited to these examples. Multiple variations and modification to the disclosed embodiments will occur, to the extent not mutually exclusive, to those skilled in the art upon consideration of the foregoing description. For example, although the method may be used in the context of a semiconductor fabrication process, actually it can apply to any integrated circuit fabrication process in which lines or other features are to be fabricated with narrow pitch. As another example, although the original features patterned lithographically into the photoresist layer 102 (FIGS. 1 and 9) are preferably created using the minimum feature size available from the employed photolithographic process, it will be appreciated that in another embodiment the primary mask may be created with a feature size larger than the minimum. Of course, as the lithographically produced feature size increases, correspondingly less benefit is gained by employing the process. All these variations and others fall well within the scope of the present invention as set forth in the following claims.

What is claimed is:

1. A method of manufacturing an integrated circuit, comprising the steps of:
   providing a patterned first material layer with features having top surfaces and sidewalls, the patterned first material layer being composed of a silicon material and being formed over a second material layer which is formed over a substrate;
   in a conversion process, consuming first material at the feature sidewalls to form third material at the feature sidewalls, the width of third material at each of the sidewalls being greater than the width of first material consumed at the respective sidewall in the conversion process;
   patterning the second material layer using the third material as mask;
   forming a fourth material layer over the substrate;
   exposing the top surfaces of the features in the first material layer through the fourth material layer;
   removing the exposed first material layer to expose portions of the second material layer through the fourth material layer; and
   further patterning the second material layer using the fourth material layer as a mask.

2. The method according to claim 1, wherein the step of providing a patterned first material layer comprises the steps of:
   forming a patterned photoresist layer on an unpatterned first material layer; and
   etching the first material layer using the patterned photoresist layer as mask.

3. The method according to claim 1, wherein the first material is a member of the group consisting of polysilicon and amorphous silicon.

4. The method according to claim 1, wherein the fourth material layer comprises an oxide.

5. The method according to claim 1, wherein the conversion process comprises a thermal oxidation process.

6. The method according to claim 5, wherein the second material layer comprises a silicon nitride.

7. The method according to claim 5, wherein the third material comprises a silicon oxide.

8. The method according to claim 1, wherein the conversion process comprises a silicide process, the silicide process comprising the steps of:
   depositing a metal layer over the first material layer;
   sintering the metal layer; and
   removing the metal layer.

9. The method according to claim 8, wherein the metal layer is a member of the group consisting of Platinum, Nickel, Cobalt, Titanium, Tantalum and Molybdenum.

10. The method according to claim 8, further comprising the step of removing the third material before the step of forming of a fourth material layer.

11. The method according to claim 1, wherein the step of exposing the top surfaces of the features in the first material layer comprises the step of planarizing the fourth material layer at least until the top surface of the features in the first material layer are exposed.

12. The method according to claim 11, wherein the step of planarizing the fourth material layer uses a dry etching process.

13. The method according to claim 11, wherein the step of planarizing the fourth material layer uses a chemical-mechanical polishing process.

14. The method according to claim 1, wherein the first layer features have a first minimum feature width,
   and wherein the second material layer after the step of further patterning the second material layer has features having a second minimum feature width,
   and wherein the first minimum feature width is larger than the second minimum feature width.

15. The method according to claim 1, wherein the first layer features include a first regular pattern of lines having a first pitch,
   and wherein the second material layer, after the step of further patterning the second material layer, has features including a second regular pattern of lines having a second pitch that is substantially one-half the first pitch.

16. The method according to claim 1, further comprising the step of removing the fourth material layer after the step of further patterning the second material layer.

17. The method according to claim 1, wherein the step of providing a patterned first material layer comprises the steps of:
   providing a patterned fifth material layer with features having top surfaces and sidewalls, the patterned fifth material layer being formed over an unpatterned first material layer;

in a preliminary conversion process, consuming fifth material at the feature sidewalls to form sixth material at the feature sidewalls, the width of sixth material at each of the sidewalls being greater than the width of fifth material layer consumed at the respective sidewall in the preliminary conversion process;

patterning the first material layer using the sixth material as mask;

forming a seventh material layer over the substrate;

exposing the top surfaces of the features in the fifth material layer through the seventh material layer;

removing the exposed fifth material layer to expose portions of the first material layer through the seventh material layer;

further patterning the first material layer using the seventh material layer as a mask; and removing the seventh material layer after the step of farther patterning the first material layer.

18. A method according to claim 1, wherein the step of providing a patterned first material layer includes the step of providing an additional mask layer superposing the patterned first material layer, the additional mask layer matching the pattern of the first material layer, further comprising the step of removing the additional mask layer prior to the step of removing the exposed first material layer.

19. A method according to claim 18, wherein the step of removing the additional mask layer occurs concurrently with the step of patterning the second material layer.

20. A method according to claim 19, wherein the additional mask layer and the second material layer consist essentially of the same material.

21. A method according to claim 19, wherein the additional mask layer and the second material layer each consist essentially of silicon nitride.

22. A method of manufacturing an integrated circuit, comprising the steps of:

providing a first material layer patterned to include features having a first regular pattern of lines having a first pitch, the lines having top surfaces and sidewalls, the first material layer being composed of a silicon material and being formed over a second material layer which is formed over a substrate;

in a thermal conversion process, thermally consuming first material at the feature sidewalls to form third material at the feature sidewalls, the width of third material at each of the sidewalls being greater than the width of first material consumed at the respective sidewall in the conversion process;

etching the second material layer using the third material as mask;

forming a fourth material layer over the substrate;

exposing the top surfaces of the features in the first material layer through the fourth material layer;

removing the exposed first material layer to expose portions of the second material layer through the fourth material layer; and further patterning the second material layer using the fourth material layer as a mask, wherein the second material layer, after the step of further patterning the second material layer, has features including a second regular pattern of lines having a second pitch that is substantially one-half the first pitch.

23. A method according to claim 22, wherein the step of providing a first material layer includes the step of providing an additional mask layer superposing the feature top surfaces, the additional mask layer matching the pattern of the first material layer, the additional mask layer consisting essentially of the same material as the second material layer, and wherein the step of etching the second material layer includes the step of removing the additional mask layer.

24. A method according to claim 22, wherein the thermal conversion process comprises a thermal oxidation process.

25. A method according to claim 24, wherein the second material layer comprises a silicon nitride and the third material comprises a silicon oxide.

26. A method according to claim 22, wherein the thermal conversion process comprises the steps of:

depositing a metal layer over the first material layer;

sintering the metal layer; and removing the metal layer.

27. A method according to claim 26, wherein the metal layer is a member of the group consisting of Platinum, Nickel, Cobalt, Titanium, Tantalum and Molybdenum.

* * * * *